United States Patent
Zory et al.

(10) Patent No.: US 7,502,990 B2
(45) Date of Patent: Mar. 10, 2009

(54) METHOD AND DEVICE FOR HANDLING WRITE ACCESS CONFLICTS IN INTERLEAVING FOR HIGH THROUGHPUT TURBO-DECODING

(75) Inventors: Julien Zory, Fernay Voltaire (FR); Filippo Speziali, S. Ilario Jonio (IT)

(73) Assignees: STMicroelectronics N.V., Amsterdam (NL); STMicroelectronics S.r.l., Agrate Brianza (IT)

( * ) Notice: Subject to any disclaimer, the term of this patent is extended or adjusted under 35 U.S.C. 154(b) by 584 days.

(21) Appl. No.: 11/037,504

(22) Filed: Jan. 18, 2005

(65) Prior Publication Data

US 2005/0190736 A1  Sep. 1, 2005

(30) Foreign Application Priority Data

Jan. 19, 2004   (EP)   ................... 04290135

(51) Int. Cl.
  *H04B 7/216*   (2006.01)
(52) U.S. Cl. .................. 714/786; 365/230.03
(58) Field of Classification Search ............. 714/786
  See application file for complete search history.

(56) References Cited

U.S. PATENT DOCUMENTS

| 6,470,047 | B1 * | 10/2002 | Kleinerman et al. ......... 375/232 |
| 7,000,169 | B2 * | 2/2006 | Shen .......................... 714/755 |
| 2002/0029364 | A1 | 3/2002 | Edmonson et al. .......... 714/755 |
| 2002/0116595 | A1* | 8/2002 | Morton ........................ 712/22 |
| 2003/0014700 | A1 | 1/2003 | Giulietti et al. ............. 714/701 |
| 2003/0048206 | A1 | 3/2003 | Gatherer et al. ............. 341/50 |

OTHER PUBLICATIONS

"Enabling High-Speed Turbo-Decoding through Concurrent Interleaving", Thul et al., Proceedings of the 2002 IEEE International Symposium on Circuits and Systems, Scottsdale, AZ, vol. 1 of 5, May 26, 2002, pp. I, 897-900, XP002229238, ISBN: 0-7803-7448-7.

"Optimized Concurrent Interleaving Architecture for High-Throughput Turbo-Decoding", Thul et al., Proceedings of International Conference on Electronics, Circuits and Systems, Dubrovnik, Croatia, Sep. 15, 2002, pp. 1099-1102, XP010614545.

* cited by examiner

Primary Examiner—Jacques H Louis-Jacques
Assistant Examiner—Enam Ahmed
(74) Attorney, Agent, or Firm—Lisa K. Jorgenson; Allen, Dyer, Doppelt, Milbrath & Gilchrist, P.A.

(57) ABSTRACT

A device for processing data to be interleaved and stored in target memories includes N interleaving buffers, N producers, and N cells. Each cell includes a register bank of size W, and a delay circuit. The variable M defines a maximum number of concurrent write operations supported per time step W, and defines a maximum buffer size. These parameters are chosen to reflect a standard case. At any time step, each of the N interleaving buffers receives m log-likelihood ratio (LLR) inputs and writes up to M of these into the register banks. When m is larger than M, m-M producers are delayed by the delay circuit. When a buffer overflow occurs (more than W LLRs values), m producers are delayed by the delay circuit. One LLR value is fetched from the register bank and is written in an SRAM interleaving memory.

31 Claims, 7 Drawing Sheets

METHOD AND DEVICE FOR HANDLING WRITE ACCESS CONFLICTS IN INTERLEAVING FOR HIGH THROUGHPUT TURBO-DECODING

FIELD OF THE INVENTION

The invention relates in general to handling write access conflicts in interleaving or de-interleaving, and in particular, for high throughput turbo-decoding.

An application of the invention is in the field of wireless communication systems, and more particularly, to CDMA systems based upon CDMA 2000, WCDMA (Wide Band CDMA), or the IS-95 standard.

BACKGROUND OF THE INVENTION

Turbo-codes were introduced in 1993 and are part of the current communication standards due to their outstanding forward error correction performance. Turbo-codes include concatenated component codes that work on the same block of information bits, separated by interleavers. The component codes are decoded individually. Key to the performance of turbo-codes is the iterative exchange of information between the component decoders.

The information exchanged iteratively represents the likelihood of the received bit k to have been sent either as $d_k=0$ or $d_k=1$. The decision is represented by the sign of the Log–

$$\text{Likelihood-Ratio}\left(LLR(d_k) = \log \frac{P(d_k = 1)}{P(d_k = 0)}\right).$$

The confidence in this decision is based upon its magnitude. From now on the information exchanged will simply be referred to as LLR.

Interleaving is scrambling the processing order to break up neighborhood-relations, which is essential for the performance of turbo-codes. The LLR produced at position k, denoted as $LLR(d_k)$, is written to position interleaved(k) in the RAM:

$$LLR_{prod}(d_k) \rightarrow LLR_{RAM}(d_{interleaved(k)}).$$

The interleaver and de-interleaver tables contain one-to-one mappings of source addresses to target addresses. TABLE 1 shows an example for reordering six LLRs to perform interleaving.

TABLE 1

| Address | Interleaved | Address | Deinterleaved |
|---------|-------------|---------|---------------|
| 1 | 3 | 1 | 6 |
| 2 | 6 | 2 | 4 |
| 3 | 5 | 3 | 1 |
| 4 | 2 | 4 | 5 |
| 5 | 4 | 5 | 3 |
| 6 | 1 | 6 | 2 |

De-interleaving brings them into the original sequence again. A 3GPP compliant table, for example, would contain up to 5114 entries.

One LLR has to be read for every LLR produced. If only one LLR is produced per time-step, interleaving can be performed on the fly through indirect addressing. However, high-throughput applications require parallel architectures that produce more than one LLR per time-step. Thus, multiple LLRs have to be read and written concurrently. The number of LLRs read and written may be denoted as N.

In 0.20 μm technology, a single producer can achieve a maximum throughput of about 7 Mbit/s assuming 10 iterations. For 100 Mbit/s, a reasonable assumption for future communication systems is that N=16 producers would be necessary and would require 16-port RAMs. However, the use of N-port RAMs to solve access conflicts is, in general, not practicable.

Read access conflicts can be avoided by using N individual memories. Write access conflicts cannot be avoided that easily. The positions where the produced LLRs have to be stored depend on the interleaver. For arbitrary interleavers, the target memory, that is, the RAM each LLR has to go to, is not known at design time. At each time-step and for each RAM, the number of LLRs to be stored can vary from 0 to N. The resulting concurrent accesses to the same single port memory are the real bottleneck in high throughput turbo-decoding.

The problem is best illustrated by taking the interleaver table of TABLE 1 for two concurrently produced LLRs and assigning its addresses to two individual RAMs. TABLE 2 shows the interleaver table entries together with the associated RAMs and relative addresses. From now on, only the interleaver is mentioned. Of course, the same concepts apply to the deinterleaver as well.

TABLE 2

| | source RAM | relative Address | Address | Interleaved | target RAM | relative Address |
|---|---|---|---|---|---|---|
| ⇒ | 1 | 1 | 1 | 3 | 1 | 3 |
| | 1 | 2 | 2 | 6 | 2 | 3 |
| | 1 | 3 | 3 | 5 | 2 | 2 |
| ⇒ | 2 | 1 | 4 | 2 | 1 | 2 |
| | 2 | 2 | 5 | 4 | 2 | 1 |
| | 2 | 3 | 6 | 1 | 1 | 1 |

The number of write accesses can be determined from the interleaver tables and the producing scheme. Assuming that the two LLRs are produced in order of ascending relative addresses (i.e., in the first time-step at the absolute addresses 1 and 4) and interleaving is performed according to TABLE 2, TABLE 3 shows the resulting write accesses.

TABLE 3

| Time-step | Write Accesses to RAM 1 | Write Accesses to RAM 2 |
|---|---|---|
| 1 | 2 | 0 |
| 2 | 0 | 2 |
| 3 | 1 | 1 |

In the first time-step, for example, one LLR is read from source RAM1 (Addr. 1) and written to target RAM1 (Addr. 3). The other one is read concurrently from source RAM2 (Addr. 1) and written to target RAM1 (Addr. 2), which results in two concurrent write accesses for target RAM1.

In Giuletti et al., "Parallel Turbo Coding Interleavers: Avoiding Collisions In Accesses To Storage Elements," IEEE Electronics Letters, Vol. 38, No. 5, February 2002, a dedicated interleaving scheme for each given architecture and block-size is derived to circumvent the potential access problems. However, this does not allow for pre-defined interleavers, as for example in a standard like 3GPP, nor for arbitrary block-lengths or degrees of parallelization.

In Thul et al., "Enabling High Speed Turbo Decoding Through Concurrent Interleaving" in ISCAS'02, May 2002, Vol. 1, pp. 897-900, a tree-based concurrent interleaving architecture, named TIBB (Tree Interleaver Bottleneck Breaker) is disclosed. The producers implement a Maximum-A-Posteriori (MAP) algorithm. All N MAP producers are connected to N-input buffers via the LLR distributor block. The drawback of this approach lies in the high-connectivity of the LLR distributor as well as the need for N-input buffers, whose combinatorial logic complexity increases exponentially with increasing values of N. Despite a two-level buffer implementation that was proposed to reduce this complexity, the area overhead of the TIBB approach grows exponentially with respect to the number of producers.

Another approach based on local buffer cells interconnected via a ring network (called RIBB) was proposed in Thul et al., "Optimized Concurrent Interleaving For High Speed Turbo Decoding", in ICECS'02, Croatia, September 2002, pp. 1099-1102. Each cell contains its own LLR distributor and either writes LLRs to the local RAM or routes them to its neighboring cells of the destination that is not the local RAM. For single-ring or double-ring architectures, this leads to local cells having a reasonable complexity and efficient architectures for up to 8 producers. Above 8 producers, the size and the number of local buffers become prohibitive and the efficiency of the network requires more than two rings to avoid high latency penalties.

In Thul et al., "Concurrent Interleaving Architectures For High-Throughput Channel Coding" in ICASSP'03, Vol. 2, pp. 613-616, April 2003, is an extension of "Optimized Concurrent Interleaving For High Speed Turbo Decoding". Thul et al. proposes a heuristic approach to generate a random graph routing network that fulfills the requirements of the interleaving for a large number of producers. However the underlying implementation complexity is still high.

SUMMARY OF THE INVENTION

An object of the invention is to provide another approach and another architecture capable of performing concurrent interleaving.

Another object of the invention is to relax the exponential relationship between the number of producers and the interleaving subsystem complexity so that the hardware complexity can be reduced.

Multiple write access per time step and large buffer size are the main contributors to the concurrent interleaving subsystem complexity. The invention is based upon an analysis made by the inventors about some properties of a pseudo random interleaving process which are explained now.

Multiple LLRs are produced at every time step by each MAP producer, and have to be consumed by the (de)-interleaving subsystem to maintain the high throughput capability of parallel turbo decoder architectures. Due to the random property of turbo interleaver patterns, up to N LLRs may have to be written concurrently in any given RAM or buffer. However, although the worst case is N concurrent accesses, an interesting property of this system is that the average number of write accesses to a given LLR memory shall be one.

The probability of having N concurrent accesses to a given buffer is very small. In fact, it is very unlikely to have more than 3 concurrent accesses to a buffer. Moreover, the probability of having m concurrent accesses to a given buffer is independent of the number of N producer elements.

Another important source of complexity of the concurrent interleaving subsystem derives from the maximum number of LLRs that needs to be stored into the buffer at any time step.

The inventors have simulated the number of LLR elements in a buffer (mean, worst and variance) with all possible code block sizes in the range (40-5114) for a Universal Mobile Telecommunications Service (UMTS) interleaver. Even if the worst-case number of elements can be quite high (almost 30 in UMTS and 130 with a random interleaver), the standard deviation and mean value stay fairly small. The probability of having more elements than the sum of the mean plus the variance values is quite small.

Thus, taking into account the interesting statistical properties of pseudo-random interleavers, the concurrent interleaving architecture is for the standard case instead of the worst case so that the hardware complexity can be reduced.

A producer stalling or delaying mechanism is provided which momentarily stops the producers in the rare occurrences of the non-standard cases. Due to the above mentioned properties of random interleavers, this only translates into a small latency penalty.

Thus, the invention proposes a method of processing output data intended to be interleaved and stored in N single port target memories, comprising producing within a current cycle of a clock signal, from N producers clocked by the clock signal, N output data including i groups $GR_i$ of $m_i$ output data intended to be stored sequentially into i target memories in accordance with predetermined interleaving information, with $1 \leq i \leq N$ and $0 \leq m_i \leq N$. For each group $GR_i$, the method may comprise determining a number $S_i$ less than or equal to $m_i$ and less than or equal to a predetermined number M less than N, and selecting $S_i$ output data among the $m_i$ output data of the group within the current cycle. The method may further include storing the $S_i$ selected output data in a register bank connected to the target memory associated to the group within the current cycle, reading one output data stored in the register bank and writing it into the associated target memory within the current cycle, and stalling during the next cycle of the clock signal, the $m_i$-$S_i$ producers having respectively produced the $m_i$-$S_i$ non-selected output data.

According to an embodiment of the invention, the register bank may comprise W elementary registers, with W being smaller than a predetermined value corresponding to the maximum number of output data that needs to be stored in the register bank in a worst case situation. The determining step may comprise determining the number WFi of elementary registers which are free within the current cycle of clock signal, with $S_i$ being equal to $\min(m_i, M, WFi)$, where min means the function minimum.

In other words, M defines the maximum number of concurrent write operations supported per time step W and the maximum buffer size supported. These design parameters are chosen to reflect the standard case. At any time step, each of the N interleaving buffers receives m LLRs inputs and has to write up to M of these into the register banks of size W. It also has to stall m-M producers whenever m is bigger than M or to stall m producers whenever a buffer overflow occurs (more than W LLRs values). It finally has to fetch one LLR value from the register bank and write it into the SRAM interleaving memory.

Although several approaches are possible for performing the selecting step, it is particularly advantageous that the selecting step comprises $S_i$ binary-tree based parallel scan operations. Each tree based scan operation can provide one selected value. As a matter of fact, such a scan process is proportional to M rather than to N.

It is also possible to further reduce the processing delay by performing two concurrent parallel scans in two opposite directions at once. In other words, according to an embodiment of the invention, the selecting step comprises $S_i/2$ two-way binary-tree based parallel scan operations. Each two-way tree based scan operation may provide two selected values.

The invention is also directed to an electronic device for processing output data intended to be interleaved and stored in N single ports target memories. The device may comprise N single port target memories, interleaving table means or circuit for storing predetermined interleaving information, N producers clocked by a clock signal for producing within a current cycle of the clock signal N output data, and distributor means or circuit to define within the set of N output data i groups GRi of $m_i$ output data intended to be interleaved and stored sequentially into i target memories in accordance with the predetermined interleaving information. The ranges for i and $m_i$ may respectively be $1 \leq i \leq N$ and $0 \leq m_i \leq N$, and N cells are respectively connected to the N producers, the distributor means and the N single port target memories. Each cell may comprise a register bank connected to the target memory connected to the cell, selecting means or circuit adapted for an eventual group GRi allocated to the cell to determine a number $S_i$ smaller than or equal to $m_i$ and smaller than or equal to a predetermined number M smaller than N, and to select $S_i$ output data among the $m_i$ output data of the group within the current cycle. Control means or circuit may be adapted to store the $S_i$ selected output data in the register bank within the current cycle to read one output data stored in the register bank and to deliver it to the associated target memory within the current cycle. A stalling or delaying mechanism may stall during the next cycle of the clock signal the $m_i$-$S_i$ producers having respectively produced the $m_i$-$S_i$ non-selected output data.

Each register bank may comprise W elementary registers. W may be less than a predetermined value corresponding to the maximum number of output data that need to be stored in the register bank in a worst case situation. The control means or circuit may be adapted to determine the number WFi of elementary registers which are free within the current cycle of clock signal, and $S_i$ is equal to min($m_i$, M, WFi), where min means the function minimum.

The selecting means may comprise M multiplexers, with each multiplexer having N inputs respectively connected to the N outputs of the N producers and one output. The M outputs of the M multiplexers are connected to the register bank, and the selecting means further comprises a logic control unit adapted to select the $S_i$ output data and to control the multiplexers accordingly.

The logic control unit may be adapted to perform $S_i$ binary-tree based parallel scan operations. Each tree based scan operation may provide one selected value.

The logic control unit may be adapted to perform $S_i/2$ two-way binary-tree based parallel scan operations. Each two-way tree based scan operation may provide two selected values. Further, each cell advantageously may have a pipelined architecture.

The electronic device according to the invention may be formed as an integrated circuit. The invention is also directed to a code-decoder or a code-encoder comprising an electronic device as defined above. The code decoder may be a turbo-code decoder.

The invention is also directed to a component of a wireless communication system, and comprising a code decoder as defined above. Such a component can form a cellular mobile phone or a base station.

BRIEF DESCRIPTION OF THE DRAWINGS

Other advantages and features of the invention will appear by examining the detailed description of the embodiments, these being in no way limiting, and of the appended drawings in which.

DETAILED DESCRIPTION OF THE PREFERRED EMBODIMENTS

Figure 1:
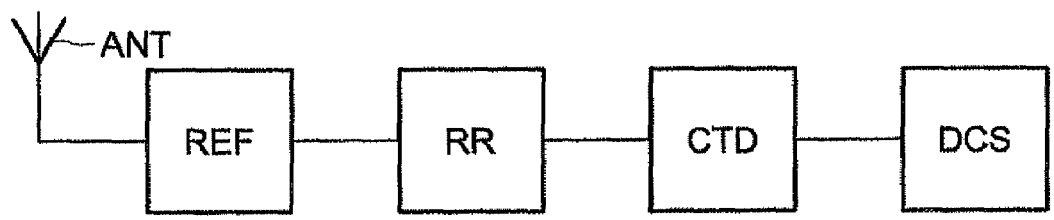
FIG. 1 is a block diagram of a receiving chain of a cellular mobile phone including an electronic device according to the invention.

Referring now to FIG. 1, a turbo-decoder according to the invention is incorporated in the reception chain of a cellular mobile phone TP. However, the invention is not limited to this particular application. The encoded signal is received by the antenna ANT, and is processed by the radio frequency stage REF of the receiver. At the output of the stage REF, the signal is converted into the digital domain by an A/D converter. The digital baseband signal is then processed by a rake demodulator RR which is used generally in the case of a CDMA system.

The channel decoding stage includes a turbo-code decoder CTD according to the invention. The processing chain also comprises a source decoding block DCS, which performs the source decoding treatments.

The third generation mobile radio system specifies convolutional codes, as well as turbo-codes as channel coding techniques (3GPP, Technical Specification Group Radio Access Network; Multiplexing and channel coding (FDD); (3G TS 25.212 version 3.5.0(2000-12)), Release 1999).

In turbo-code encoders forward error correction is enabled by introducing parity bits. For turbo-codes, the original information, denoted as systematic information, is transmitted together with the parity information. The encoder for 3GPP includes two recursive systematic convolutional (RSC) encoders with constraint length K=4, which can also be interpreted as 8-state finite state machines. The first RSC encoder works on the block of information in its original sequence, the second one in an interleaved sequence.

On the receiver side, there is a corresponding component decoder for each of them. Each component decoder implements for example a Maximum-A-Posteriori (MAP) algorithm, and is usually a Soft-in-Soft-out (SISO) decoder.

Each block of information is decoded in an iterative manner. The systematic information and the parity information serve as inputs of the first component decoder (MAP1). The soft-output of MAP1 reflects its confidence on the received bits of being sent either as a logic 0 or a logic 1. These confidences are interleaved in the same manner as in the encoder and passed to the second component decoder (MAP2) as a-priori information. The second component decoder uses this information to bias its estimation comprising the interleaved systematic information and the parity information of the second encoder. The soft-outputs are again passed on to MAP1, and so on. The exchange continues until a stop criteria is fulfilled. Stop criteria range from simple cases, such as fixed number of iterations over cyclic redundancy check (CRC) to rather complex statistical analysis.

Implementation issues for turbo-decoder architectures using the MAP algorithm have already been discussed in several papers and are well known (A. Worm, "Implementation Issues of Turbo-Decoders," PhD thesis, Institute of Microelectronic Systems, Departement of Electrical Engineering and Information Technology, University of Kaiserslautern, Forschungsberichte Mikroelektronik, Bd.3, Germany, 2001).

The MAP algorithm is transformed into the logarithmic domain to reduce operator strength (P. Robertson et al., "A Comparison of Optimal and Sub-Optimal MAP Decoding Algorithms Operating in the Log-Domain," Proc. 1995, International Conference on Communications (ICC'95), June 1995, Seattle, Wash., USA). Multiplications become additions, and additions are replaced by a modified comparison. It includes a forward recursion, a backward recursion and soft-output calculation.

Decoding turbo codes by searching the most likely code word is far too complex. Therefore, iterative decoding is advised. The two convolutional codes are decoded separately. While doing this, each decoder incorporates information that has been gathered by the other. This gathering of information is the exchange of soft-output values, where the bit estimates of one unit are transformed into a priori information for the next. The decoders thus have to be soft-input soft-output (SISO) units.

The confidence in the bit estimation is represented as a Log-Likelihood-Ratio (LLR):

$$\Lambda(d_k) = \ln\frac{P(d_k = 1)}{P(d_k = 0)}$$

The sign shows whether this bit is supposed to be one or zero, whereas the confidence in the decision is represented by the magnitude.

To extract the information that has been gathered during the last decoding stage, the systematic and a priori information that lead to this estimate have to be subtracted. This yields:

$$L^1(d_k)=\lambda^1(d_k)-y_k^s-L_{deint}^2(d_k)$$

$$L^2(d_k)=\lambda^2(d_k)-y_{kint}^s-L_{int}^1(d_k)$$

This is called the extrinsic information. The confidence of one decoder in a bit to have a certain value biases the initial guess of the other.

Figure 2:
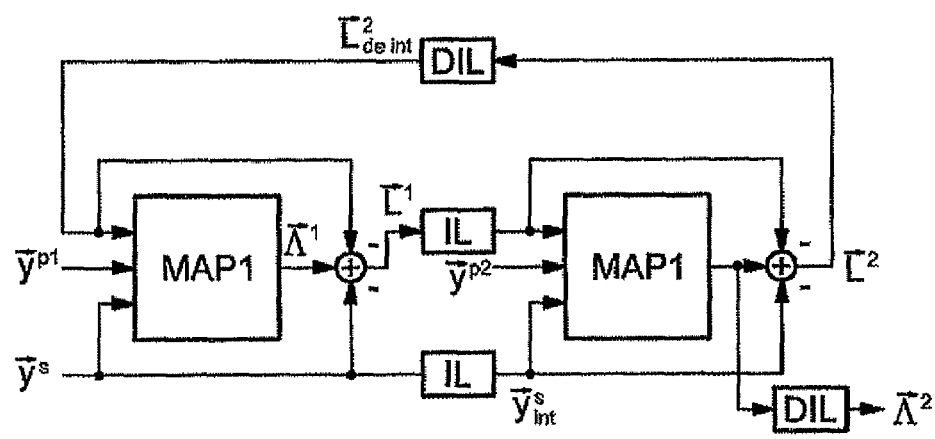
FIG. 2 is a block diagram of a turbo-decoder including an electronic device according to the invention.

FIG. 2 shows such a turbo code decoder CTD including two MAP decoders, interleaving means IL and de-interleaving means DIL. Feeding the input of one decoder as a priori information input to the next enables the improvement over the decoding iterations. It also gave turbo codes their name, as it resembles the feedback-of-exhaust used in combustion turbo engines. Inputs to the decoder are the received channel values (systematic, parity1 and parity2). During the very first MAP1 operation, the a priori information is set to zero.

In addition to the SISO decoders MAP1 and MAP2, memories are needed to store the input and output values, and in particular, for the interleaver and deinterleaver pattern.

Figure 3:
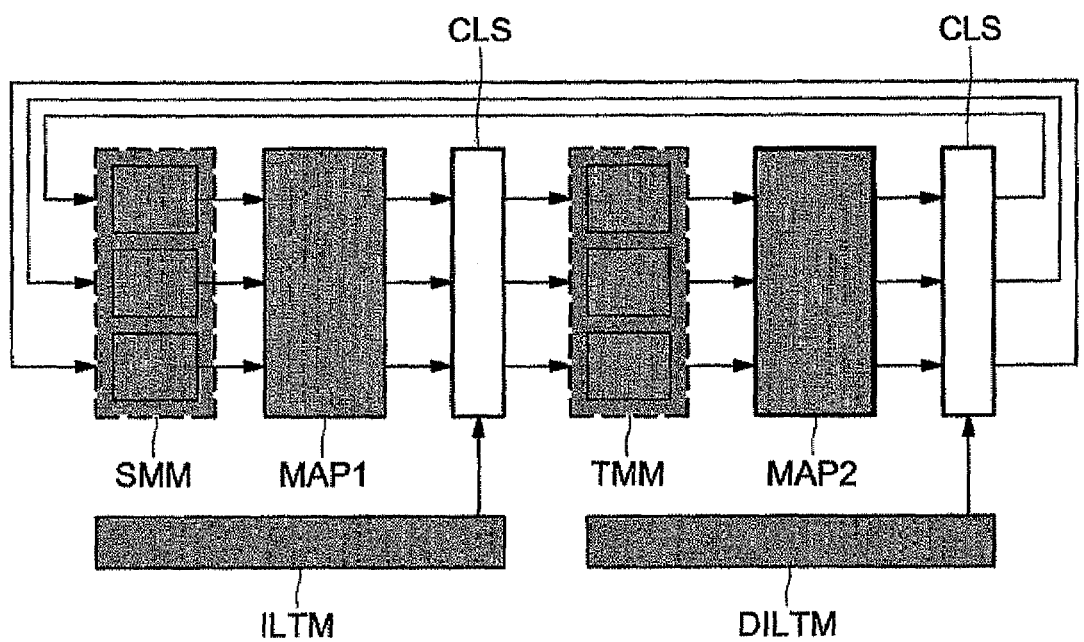
FIG. 3 is a block diagram of an electronic device according to the invention incorporated in a turbo-code decoder.

FIG. 3 shows diagrammatically some of these memories. More precisely, in this example the MAP1 unit, as well as the MAP2 unit, is a multi-LLR producer which has N outputs (N=3) for producing, per cycle of the clock signal which clocks the MAP unit, N data (N LLR) respectively associated to N input data. The N input data is respectively stored in N elementary source memories which form a source memory SMM. Of course, the multi LLR producer can be considered as being N producers each producing one LLR.

A structure CLS of N cells is connected to the N outputs of the MAP1 unit as well as to interleaving table means provided by N interleaving tables. After having passed through the structure CLS, the N produced data (the N produced LLR) are stored in a target memory TMM provided by N target memories.

Each of the source memory and the target memory is a single port memory. For the MAP2 unit, the target memory TMM functions as a source memory means and the source memory means SMM of the MAP1 unit acts as a target memory for the MAP2 unit. Further, the interleaving table means is replaced by de-interleaving table means DILTM.

Figure 4:
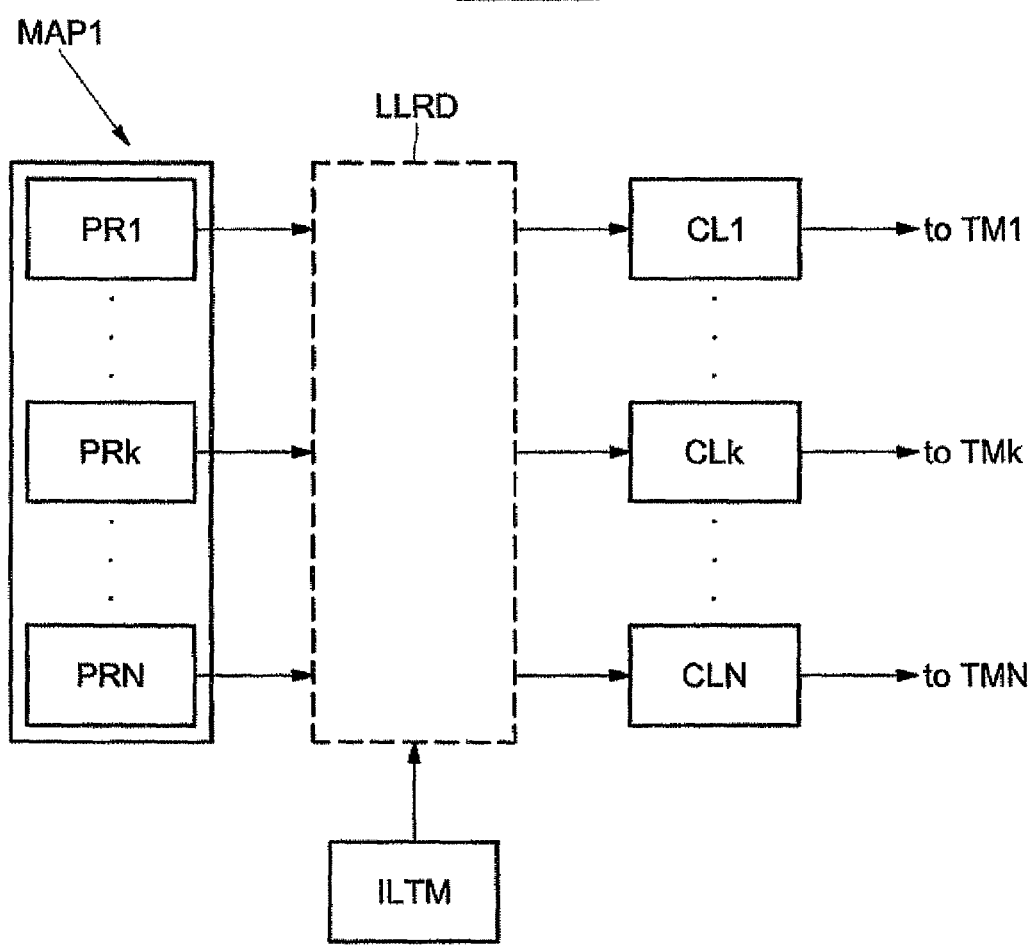
FIG. 4 is a block diagram illustrating in more detail part of an electronic device according to the invention.

As illustrated in FIG. 4, distributor means LLRD are connected to the N producers PR1-PRN of the MAP1 unit and to the interleaving table means ILTM. The N-output data (LLRs) respectively delivered by the N producers are stored in output registers (not illustrated). The set of these N-output data comprises i groups $GR_i$ of $m_i$ output data intended to be interleaved and stored sequentially into i target memories in accordance with the predetermined interleaving information. Of course, i is greater than or equal to 1 and is smaller than or equal to N, whereas $m_i$ is greater than or equal to 0 and smaller than or equal to N.

The distributor means LLRD defines these groups and delivers corresponding validity signals dV to the N cells. The logic value 0 or 1 of each validity signal dV is determined by the distributor means in accordance with the interleaving information contained in the interleaving table means. Such distributor means are conventional in the field of turbo-decoders for example, and can be, formed by combinational logic using conventional software logic design tools, for example.

Figure 5:
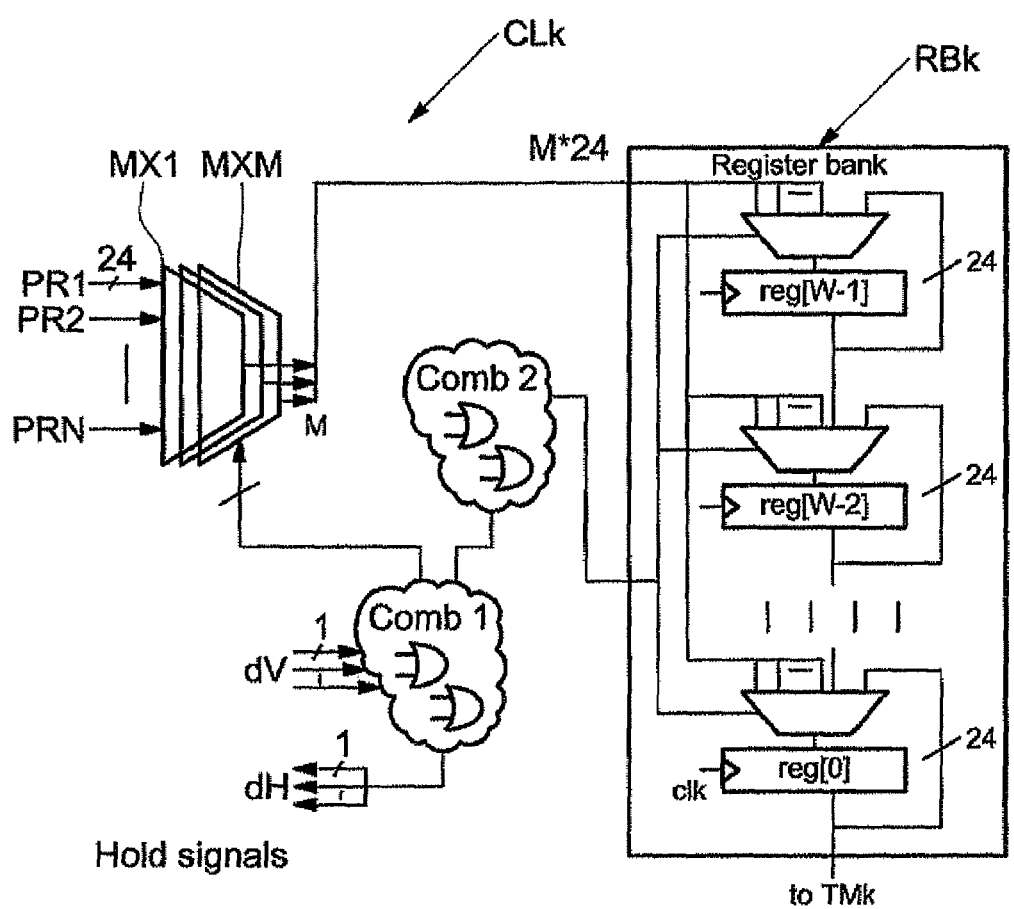
FIG. 5 is a schematic diagram illustrating a cell or interleaving buffer according to a first embodiment of the invention.

As illustrated in FIG. 5, each cell CLk comprises a register bank RBk connected to the target memory TMk which is connected to the cell.

The register bank comprises W elementary registers reg[0]-reg[W−1], with W being smaller than a predetermined value corresponding to the maximum number of output data that need to be stored in the register bank in a worst case situation.

For example, for an UMTS application with a code block length of 5114 and 8 producers, the maximum value of W in the worst case is equal to 20, whereas the invention allows for the value W to be reduced to 10, for example.

The register bank RBk which can be considered as being a FIFO, is provided with a read pointer and a write pointer which are controlled by control means Comb2. Control means Comb2 may be formed by logic gates in a conventional manner.

Referring to the register bank RBk, the cell CLk comprises M multiplexers MX1-MXM. Each multiplexer has N inputs respectively connected to the N outputs of the N producers, and one output. The M outputs of the M multiplexers are connected to the registered bank RBk. A logic control unit Comb1, which receives the valid signals dV and which cooperates with control means Comb2, is adapted to control the M multiplexers.

During a current cycle of the clock signal clocking the N producers, the cell CLk (interleaving buffer) receives m LLR inputs and has to write up to M of these into the register bank of size W. It also has to stall m-M producers whenever m is bigger than M or to stall M producers whenever a buffer overflow occurs (more than W LLRs values). In other words, the multiplexers are controlled to select, among the m received LLRs, S value, with S being smaller than or equal to m and smaller than or equal to M.

For taking into account the actual content of the register bank, the control means Comb2 determine the number WF of elementary registers which are free within the current cycle of the clock signal. S is equal to min (m, M, WF), with min meaning the function minimum.

Finally, the interleaving buffer has to fetch one LLR value from the register bank and write it into the corresponding target memory TMk. More precisely, the Comb1 logic is in charge of scanning the LRR input ports and piloting the multiplexers control signals. It is also in charge of generating the hold signals dH to stall m-M producers whenever m greater than M concurrent writes are requested or a buffer overflow occurs. The Comb2 logic is in charge of the routing of LLRs to the register bank and will control the FIFO tail pointer.

The S selected LLRs are extracted from the corresponding output registers of the producer during the current cycle of the clock signal, and are actually transmitted to the corresponding interleaving buffer. During the next cycle of the clock signal, the corresponding LLR values are maintained in the output registers, and the m-S other producers are stalled. Of course, if during the next cycle of the clock signal, one LLR can be actually delivered to the corresponding interleaving buffer because, for example, this buffer contains a free-elementary register, this LLR value will be delivered to the corresponding interleaving buffer during the next cycle and the corresponding producer will not be stalled during the cycle following the next cycle. Otherwise, this corresponding producer will again be stalled during the cycle following the next cycle of the clock signal.

Due to the stalling mechanism, the interleaving subsystem can be efficiently dimensioned for the standard case. The proposed architecture includes the N, M and W design parameters. Die area and achievable frequency are important design metrics of the concurrent interleaving design of the present invention. Parametric VHDL models of the architecture have been developed to synthesize it for different values of N, M and W. ASIC synthesis was performed using the Synopsys Design Compiler with 0.18 μm and 0.13 μm STMicroelectronics CMOS technologies. Results are given in TABLE 4 and TABLE 5 (LLR bit-width is set to 24 bits). These results are per buffer and include both the control logic and the register banks as depicted in FIG. 5.

TABLE 4

| N | M | Area (μm²) 0.18 μm | 0.13 μm | Delay (ns) 0.18 μm | 0.13 μm |
|---|---|---|---|---|---|
| 2 | 2 | 58,195 | 39,236 | 12.57 | 4.89 |
| 4 | 3 | 75,599 | 43,146 | 22.90 | 9.40 |
| 4 | 4 | 81,887 | 46,675 | 27.25 | 13.89 |
| 8 | 3 | 81,866 | 46,982 | 37.89 | 15.18 |
| 8 | 8 | 141,623 | 81,814 | 66.18 | 32.20 |
| 16 | 3 | 96,931 | 55,035 | 61.48 | 32.60 |
| 16 | 16 | 462,215 | 240,851 | 114.81 | 64.12 |

TABLE 5

| N | M | W | Code block length | Area (μm²) 0.18 μm | Latency (per Code block) | total penalty |
|---|---|---|---|---|---|---|
| 4 | 4 | 17 | 4367 | 109261 | 1099 | — |
| 4 | 3 | 10 | 4367 | 55779 | 1103 | 4 |
| 8 | 8 | 20 | 2816 | 211963 | 364 | — |
| 8 | 3 | 10 | 2816 | 64901 | 366 | 2 |
| 16 | 16 | 24 | 4000 | 602910 | 263 | — |
| 16 | 3 | 10 | 4000 | 82710 | 284 | 21 |

TABLE 4 demonstrates the large die area saving that can be achieved by exploiting the statistical properties of a pseudo-random interleaver with a stalling mechanism. Of course, this very same stalling mechanism introduces some delays in the decoding process. However, the stalling penalty is very small with respect to the large die area savings.

TABLE 5 illustrates the actual cycle penalty figures that were measured with UMTS interleaving tables for different values of N, M and W. These penalty results for UMTS are even better than what one could expect from a theoretical analysis. Indeed, the stalling mechanism introduces an additional degree of randomness into the UMTS interleaver that compensates the fixed row permutation table of the standard.

TABLE 5 also demonstrates the impact of the parameter W on the die area of the interleaving subsystem. For an eight producer parallel turbo decoder, the architecture according to the invention divides the die area of the interleaving subsystem by 3.3 with less than 0.8% penalty. Similarly, with sixteen producers, it divides the die area by 7.3 with a 7.9% penalty. The amount of stalling penalty depends on the actual interleaving table. Results in TABLE 5 were selected to highlight some of the largest penalty figures encountered. However, in most of the cases, the penalty is lower than 1 or 2%.

Figure 6:
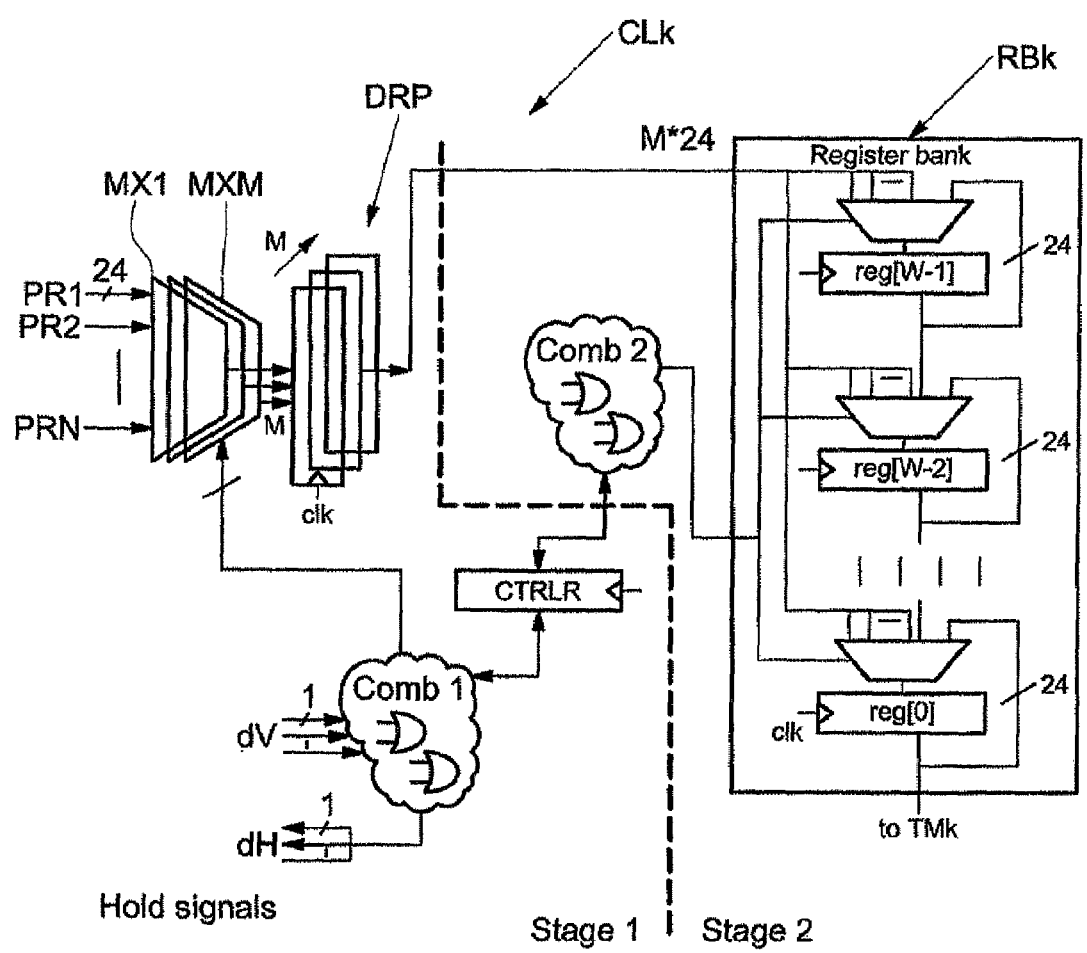
FIG. 6 is a schematic diagram illustrating a pipelined architecture for a cell or interleaving buffer according to the invention.

One prior art way to relax the critical path delay is to introduce some pipelining. In FIG. 6, the dashed bold line separates the two stages of a pipelined architecture. The aim is, of course, to distribute the Comb1 and Comb2 delays onto two clock boundaries. M data registers DRP, as well as some control registers CTRLR are introduced without any visible impact on the die area.

With this straightforward pipeline structure, the hold signals dH can still be routed back to the MAP producers in the same cycle of the clock signal. Further increasing the depth of the pipeline would become critical as it would introduce a delay in the stalling command propagation, and would require additional buffers of size N (and not M).

As explained above, one task of the interleaving buffer includes scanning all N enable input signals so as to select up to M LLR values which will then be written into the register bank. The immediate implementation of this scan process naturally leads to a delay that is linear with the number of inputs, i.e., the delay complexity is θ(N). As a consequence, since the delay grows linearly with N, the achievable throughput for a given operating frequency can be increased, but the maximum achievable throughput of the turbo decoder does not grow.

The statistical analysis of the random interleaver properties revealed that the parameter M can have a very small value, independent of the number of producers, N. It is therefore interesting to explore a scan process that would be proportional to M rather than to N.

Figure 7:
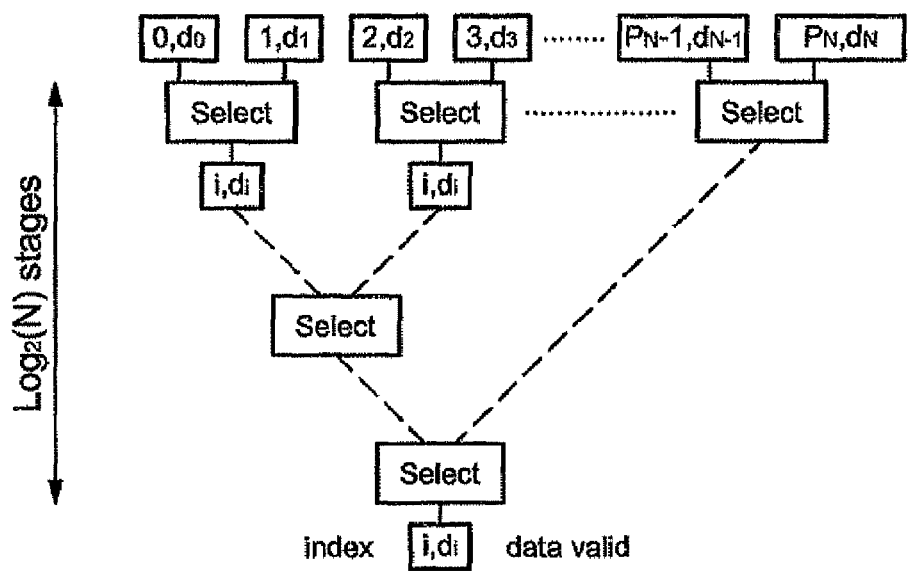
FIG. 7 is a block diagram illustrating a tree-based parallel scan according to the invention.

As depicted in FIG. 7, it is possible to implement a binary-tree based scan operation whose delay complexity depends on the tree height, hence follows θ($\log_2$(N)). One single tree scan operation only produces one result. It extracts the position of one (and only one) 1-valued enable signal (index i and data $d_i$). By repeating this procedure M times, the position of M LLR enable signals (to be written in the register bank) can be found with a delay complexity following θ(M×$\log_2$(N)).

Figure 8:
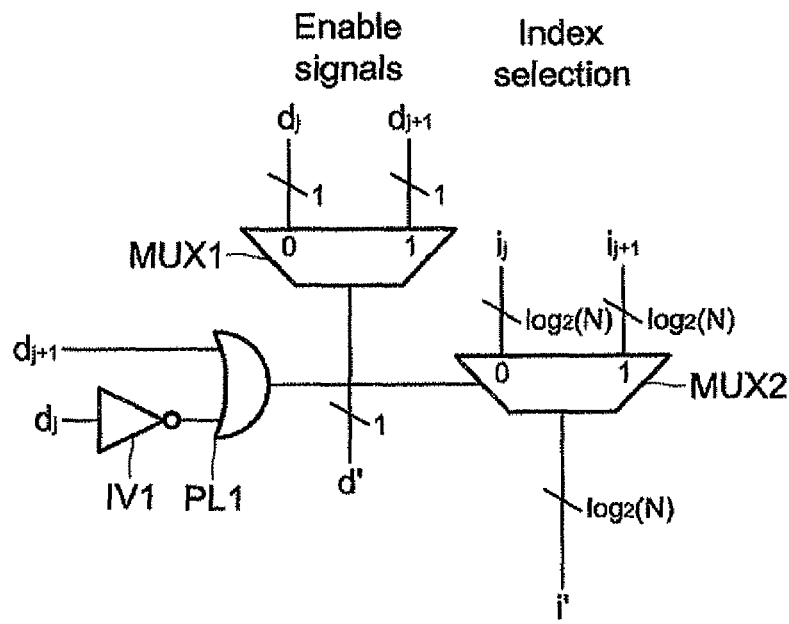
FIG. 8 is a schematic diagram of a select unit logic according to the invention for performing a tree-based parallel scan.

The logic required to perform a single binary select operation is shown in FIG. 8. It includes one OR gate PL1, one inverter IV1, one 2-input multiplexer MUX1 and one $\log_2$(N)-input multiplexer MUX2 that is used to propagate the 1-valued enable signal position.

It is possible to further reduce the processing delay by performing two concurrent parallel scans in two opposite directions at once. This further reduces the delay complexity to θ(M/2×$\log_2$ (N)).

Figure 9:
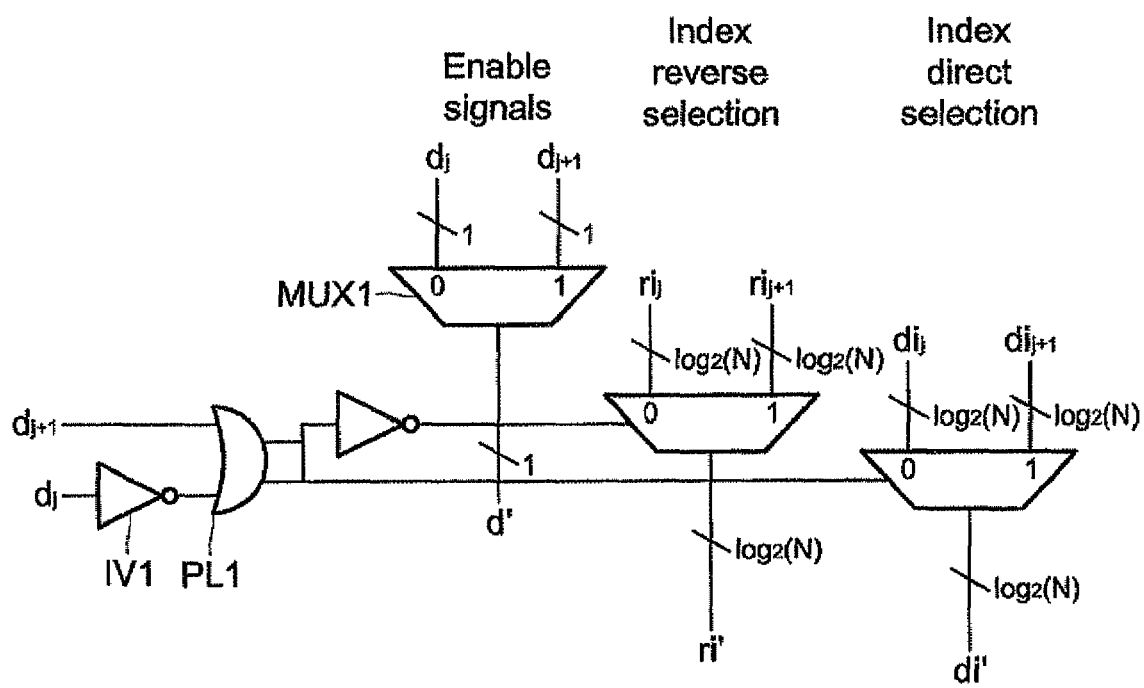
FIG. 9 is a schematic diagram of a select unit according to the invention adapted to perform a direct and reverse scan.

As M=3 provides a good compromise between the complexity reduction and the stalling penalty, the architecture disclosed herein can perform the complete scan in only two iterations. The reverse scan operation can be implemented with a very limited logic overhead with respect to the direct scan operation. Reference is directed to FIG. 9, which illustrates another inverter and another $\log_2$ (N)-input multiplexer.

The invention claimed is:

1. A method for processing data to be interleaved and stored in N target memories, the method comprising:
   producing within a current cycle of a clock signal, from N producers clocked by the clock signal, N data including i groups $GR_i$ of $m_i$ output data to be stored sequentially into i target memories in accordance with interleaving information, with $1 \leq i \leq N$ and $0 \leq m_i \leq N$; and
   for each group $GR_i$ comprising
       determining a number $S_i$ less than or equal to $m_i$ and less than or equal to a number M less than N, and selecting $S_i$ data among the $m_i$ data of the group within the current cycle,
       storing the $S_i$ selected data in a register bank connected to the target memory associated to the group within the current cycle,
       reading data stored in the register bank, and writing the data into the associated target memory within the current cycle, and
       delaying during a next cycle of the clock signal the $m_i$-$S_i$ producers having respectively produced the $m_i$-$S_i$ non-selected data.

2. A method according to claim 1, wherein the target memories each comprises a single port target memory.

3. A method according to claim 1, wherein the register bank comprises W elementary registers, with W being less than a value corresponding to a maximum number of output data to be stored in the register bank in a worst case situation; and wherein the determining comprises determining the number WFi of elementary registers which are free within the current cycle of the clock signal, with $S_i$ being equal to a minimum function.

4. A method according to claim 1, wherein the selecting comprises $S_i$ binary-tree based parallel scan operations, and each tree based scan operation provides one selected value.

5. A method according to claim 4, wherein the selecting further comprises $S_i/2$ two-way binary-tree based parallel scan operations, with each two-way tree based scan operation providing two selected values.

6. An electronic device for processing data to be interleaved and stored, the electronic device comprising:
   N target memories;
   an interleaving table for storing interleaving information;
   N producers being clocked by a clock signal for producing within a current cycle of the clock signal N data;
   a distributor for defining within the set of N data, i groups $GR_i$ of $m_i$ data to be interleaved and stored sequentially into i target memories in accordance with the interleaving information, with $1 \leq i \leq N$ and $0 \leq m_i \leq N$; and
   N cells respectively connected to the N producers, the distributor and the N target memories, each cell comprising
       a register bank connected to a respective target memory connected to the cell,
       a selector circuit for selecting a group $GR_i$ allocated to said cell, for determining a number $S_i$ less than or equal to $m_i$ and less than or equal to a number M less than N, and for selecting $S_i$ output data among the $m_i$ output data of the group within the current cycle,
       a control circuit for storing the $S_i$ selected data in said register bank within the current cycle, for reading data stored in said register bank, and for delivering the data to said respective target memory within the current cycle, and
       a delaying circuit for delaying during a next cycle of the clock signal the $m_i$-$S_i$ producers having respectively produced the $m_i$-$S_i$ non-selected data.

7. An electronic device according to claim 6, wherein the target memories each comprises a single port target memory.

8. An electronic device according to claim 6, wherein each register bank comprises W elementary registers, with W being less than a value corresponding to a maximum number of output data to be stored in said register bank in a worst case situation; and wherein said control circuit determines a number WFi of elementary registers which are free within the current cycle of the clock signal, with $S_i$ being equal to a minimum function.

9. An electronic device according to claim 6, wherein the selector circuit comprises:
   M multiplexers, with each multiplexer having an output and N inputs respectively connected to the N outputs of said N producers, the outputs of said M multiplexers being connected to said register banks; and
   a logic control unit for selecting the $S_i$ output data, and for controlling said M multiplexers.

10. An electronic device according to claim 9, wherein said logic control unit performs $S_i$ binary-tree based parallel scan operations, with each tree based scan operation providing one selected value.

11. An electronic device according to claim 10, wherein said logic control unit further performs $S_i/2$ two-way binary-tree based parallel scan operations, with each two-way tree based scan operation providing two selected values.

12. An electronic device according to claim 6, wherein each cell comprises a pipelined architecture.

13. An electronic device according to claim 6, further comprising a substrate, and wherein said N target memories, said interleaving table, said N producers, said distributor and said N cells are on said substrate so that the electronic device is an integrated circuit.

14. An electronic device according to claim 6, wherein said N target memories, said interleaving table, said N producers, said distributor, and said N cells function as a code decoder.

15. An electronic device according to claim 6, wherein said N target memories, said interleaving table, said N producers, said distributor, and said N cells function as a turbo-code decoder.

16. An electronic device according to claim 6, wherein said N target memories, said interleaving table, said N producers, said distributor, and said N cells function as a code encoder.

17. An electronic device according to claim 6, wherein said N target memories, said interleaving table, said N producers, said distributor, and said N cells function as a turbo-code encoder.

18. An electronic device according to claim 6, wherein said N target memories, said interleaving table, said N producers, said distributor, and said N cells function as an interleaver.

19. An electronic device according to claim 6, wherein said N target memories, said interleaving table, said N producers, said distributor, and said N cells function as a de-interleaver.

20. A receiver comprising:
    a radio frequency (RF) stage for receiving encoded signals; and
    a decoding stage connected to said RF stage for decoding the encoded signals, said decoding stage comprising
        N target memories,
        N producers clocked by a clock signal for producing within a current cycle of the clock signal N data,
        a distributor for defining within the set of N data, i groups $GR_i$ of $m_i$ data to be interleaved and stored sequentially into i target memories in accordance with interleaving information, with $1 \leq i \leq N$ and $0 \leq m_i \leq N$, and
        N cells respectively connected to said N producers, said distributor, and said N target memories, each cell comprising
            a register bank connected to said target memory connected to the cell,
            a selector for selecting a group $GR_i$ allocated to said cell, determining a number $S_i$ less than or equal to $m_i$ and less than or equal to a number M less than N, and for selecting $S_i$ data among the $m_i$ data of the group within the current cycle,
            a controller for storing the $S_i$ selected output data in said register bank within the current cycle, for reading output data stored in said register bank, and for delivering the data to said associated target memory within the current cycle, and
            a delaying circuit for delaying during a next cycle of the clock signal, the $m_i$-$S_i$ producers having respectively produced the $m_i$-$S_i$ non-selected data.

21. A receiver according to claim 20, wherein said target memories each comprises a single port target memory.

22. A receiver according to claim 20, wherein each register bank comprises w elementary registers, with W being less than a value corresponding to a maximum number of data to be stored in said register bank in a worst case situation; and wherein said controller determines a number WFi of elementary registers which are free within the current cycle of the clock signal, with $S_i$ being equal to a minimum function.

23. A receiver according to claim 20, wherein said selector comprises:
    M multiplexers, with each multiplexer having an output and N inputs respectively connected to the N outputs of said N producers, the outputs of said M multiplexers being connected to said register banks; and
    a logic control unit for selecting the $S_i$ output data, and for controlling said M multiplexers.

24. A receiver according to claim 23, wherein said logic control unit performs $S_i$ binary-tree based parallel scan operations, with each tree based scan operation providing one selected value.

25. A receiver according to claim 24, wherein said logic control unit further performs $S_i/2$ two-way binary-tree based parallel scan operations, with each two-way tree based scan operation providing two selected values.

26. A receiver according to claim 20, wherein each cell comprises a pipelined architecture.

27. A receiver according to claim 20, wherein said decoding stage comprises a code decoder.

28. A receiver according to claim 20, wherein said decoding stage comprises a turbo-code decoder.

29. A receiver according to claim 20, wherein said decoding stage functions as a de-interleaver.

30. A receiver according to claim 20, wherein said RF stage and said decoding stage are integrated within a cellular mobile phone.

31. A receiver according to claim 20, wherein said RF stage and said decoding stage are integrated within a base station.

* * * * *

UNITED STATES PATENT AND TRADEMARK OFFICE
CERTIFICATE OF CORRECTION

PATENT NO. : 7,502,990 B2  Page 1 of 1
APPLICATION NO. : 11/037504
DATED : March 10, 2009
INVENTOR(S) : Julien Zory and Filippo Speziali It is certified that error appears in the above-identified patent and that said Letters Patent is hereby corrected as shown below:

Column 7, Line 59   Delete: " $L^1(d_k) = \lambda^1(d_k) - y_k^s - L^2_{deint}(d_k)$ "

Insert: -- $L^1(d_k) = \Lambda^1(d_k) - y_k^s - L^2_{deint}(d_k)$ --

Column 7, Line 61   Delete: " $L^2(d_k) = \lambda^2(d_k) - y^s_{k\,int} - L^1_{int}(d_k)$ "

Insert: -- $L^2(d_k) = \Lambda^2(d_k) - y^s_{k\,int} - L^1_{int}(d_k)$ --

Column 14, Line 12  Delete: "bank comprises w elementary registers, with W being less"
Insert: -- bank comprises W elementary registers, with W being less --

Signed and Sealed this

Eleventh Day of August, 2009

David J. Kappos
*Director of the United States Patent and Trademark Office*